United States Patent
Lee et al.

(10) Patent No.: US 6,455,402 B2
(45) Date of Patent: Sep. 24, 2002

(54) METHOD OF FORMING RETROGRADE DOPING FILE IN TWIN WELL CMOS DEVICE

(75) Inventors: Joo-Hyong Lee, Cheongju-shi; Jeong-Hwan Son, Taejon-shi, both of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/811,590

(22) Filed: Mar. 20, 2001

Related U.S. Application Data

(62) Division of application No. 09/488,549, filed on Jan. 21, 2000.

(30) Foreign Application Priority Data

Jan. 22, 1999 (KR) .............................. 99-1909

(51) Int. Cl.$^7$ .................... H01L 21/425; H01L 21/8238
(52) U.S. Cl. ...................... 438/527; 438/217; 438/228; 438/919
(58) Field of Search ................................ 438/217, 223, 438/224, 227, 228, 527, 529, 530, 531, 914, 919

(56) References Cited

U.S. PATENT DOCUMENTS

| | | |
|---|---|---|
| 4,661,202 A | 4/1987 | Ochii |
| RE35,613 E | 9/1997 | Yasuda et al. |
| 5,763,921 A | 6/1998 | Okumura et al. |
| 5,795,803 A * | 8/1998 | Takamura .................. 438/228 |
| 5,814,866 A | 9/1998 | Borland |
| 6,017,785 A | 1/2000 | Han et al. |
| 6,096,611 A * | 8/2000 | Wu .............................. 438/289 |

FOREIGN PATENT DOCUMENTS

| | | | |
|---|---|---|---|
| EP | 0358246 | * 3/1990 | |
| JP | 3-173172 | * 7/1991 | ........ 438/FOR 219 |
| JP | 5-36917 | * 2/1993 | ........ 438/FOR 169 |

OTHER PUBLICATIONS

Wolf et al., Silicon Processing for the VLSI Era vol. 1: Process Technology, Lattice Press, Sunset Beach, California, 1986, pp.57–58.*

* cited by examiner

Primary Examiner—Howard Weiss
Assistant Examiner—Marcos D. Pizarro-Crespo
(74) Attorney, Agent, or Firm—Birch, Stewart, Kolasch & Birch, LLP

(57) ABSTRACT

The method of fabricating a semiconductor device includes the steps of selectively forming an insulating oxide layer in a semiconductor substrate having a first conductivity type, wherein the semiconductor substrate has first and second regions; forming impurity layers having a second conductivity type in the first and second regions of the semiconductor substrate; forming a first mask layer in the second region of the semiconductor substrate; forming impurity layers having the second conductivity type in the first region of the semiconductor substrate by performing serial ion implantations with different doses of dopants at different acceleration energies; forming a second mask layer in the first region of the semiconductor substrate; and forming impurity layers having the first conductivity type in the second region of the semiconductor substrate by performing serial ion implantations with different doses of dopants at different acceleration energies.

6 Claims, 6 Drawing Sheets

METHOD OF FORMING RETROGRADE DOPING FILE IN TWIN WELL CMOS DEVICE

This application is a divisional of co-pending application Ser. No. 09/488,549, filed on Jan. 21, 2000, the entire contents of which are hereby incorporated by reference and for which priority is claimed under 35 U.S.C. § 120; and this application claims priority of Application No. 99-1909 filed in KOREA on Jan. 22, 1999 under 35 U.S.C. § 119.

BACKGROUND OF THE INVENTION

1. Field of the Invention

The present invention relates to a twin well CMOS (complimentary metal oxide semiconductor) device, and a fabrication method therefor. More particularly, the present invention relates to a twin well CMOS device and fabrication method therefor which are less susceptible to lateral diffusion of a well caused by misalignment in lithography.

2. Discussion of Conventional Art

FIG. 1 is a cross-sectional view of a related art semiconductor device.

The related art semiconductor device, e.g., a CMOS inverter circuit, has P well 22b and N well 21 which are formed in a P-type semiconductor substrate 11. An insulating oxide layer 13 is formed to define the active and isolation regions of the device. Heavily doped P-type regions 27 and 28 are formed in the N well 21 by using a first gate 37 overlying a gate insulating layer 23 as a mask. A heavily doped N-type region of N-well contact 30 is then formed at a predetermined portion in the N well 21. The heavily doped P-type regions 27 and 28 become the drain and source regions of P-channel FET, respectively. Heavily doped N-type regions 25 and 26 are formed in the P well 22b by using a second gate 38 overlying the gate insulating layer 23 as a mask. A heavily doped P-type region of P-well contact 29 is then formed at a predetermined portion in the P well 22b. The heavily doped N-type regions 25 and 26 become the source and drain regions of N-channel FET, respectively. A heavily doped P-type buried layer 22a surrounds the N well 21 completely.

In the CMOS inverter circuit 39 having the above-described structure, the P-well contact region 29 and the source region 25 of N-channel FET are connected to a ground line $V_{SS}$, while the source region 28 of P channel FET and the N-well contact region 30 are connected to a power source $V_{DD}$. The first and second gates 37 and 38 are connected to an input line $V_{IN}$, and the drains 26 and 27 of N channel and P channel FETs are connected to an output line $V_{OUT}$.

In operation, a signal applied to line $V_{IN}$ at a high logic voltage level will cause the N channel FET to turn on. At the same time, it turns the P channel FET off, such that substantially no current flows between the drain and source regions 27 and 28 of P channel FET.

The output line $V_{OUT}$ connected to the drain regions 26 and 27 is therefore pulled to the lower supply voltage $V_{SS}$ through the N channel FET. The CMOS inverter circuit 39 therefore effectively inverts an input high logic voltage level to an output low logic voltage level. P+ layer 22a is heavily doped with p type impurities that works as a p+ guard ring around an NMOS transistor to separate NMOS and PMOS transistors to be fabricated in the corresponding conductive type wells, thereby minimizing the possibility of latch-up.

FIGS. 2A to 2D show cross-sectional views of a semiconductor device of the related art during its fabrication in which six ion-implantations are carried out by controlling the parameters of the ion accelerator in the ion injection apparatus.

Referring to FIG. 2A, an insulating layer 13 for device isolation is formed on a p-type semiconductor substrate 11 by local oxidation of silicon (LOCOS) to define active regions of a device. A first photoresist 111 is formed on the substrate 11, except the region where an N well is formed by ion implantation where a photoresist 111 is formed with a thickness of 2.0 μm. A first ion implantation (101) is carried out on the exposed substrate 11 with P ions having implantation energy of 1.0 MeV, thereby forming a lower layer 101 of a retrograde N well. Then, a second ion implantation (102) is carried out on the exposed substrate 11 with P ions having implantation energy of 450 KeV, thereby forming an upper layer 102 of a retrograde N well. A third ion implantation (103) is carried out on the exposed substrate 11 with P ions having an implantation energy of 60 KeV, thereby forming a threshold voltage controlling layer 103 of a retrograde N well at the top portion of the substrate 11.

Referring to FIG. 2B, with the same photoresist 111 exposing the N well area only, a fourth ion implantation (141) is carried out on the entire substrate 11 with B ions having an implantation energy of 2.0 MeV which is high enough to penetrate through the first photoresist 111 into the substrate of P well forming area, thereby forming an upper layer 141 of a retrograde P well and a guard ring layer 140 at the lowest part of the N well forming area in the substrate 11. In this case, the guard ring layer 140 helps to isolate the N well from the substrate and the neighboring P well completely after diffusion of the B impurities.

Referring to FIG. 2C, after the first photoresist has been removed from the substrate 11, a second photoresist 112 is formed on the substrate 11 except the region where a P well will be formed. A fifth ion implantation (142) is carried out on the exposed substrate 11 with B ions having an implantation energy of 1.25 MeV, thereby forming a lower layer 142 of the retrograde P well at the bottom portion of the substrate 11. Finally, a sixth ion implantation (143) is carried out on the exposed substrate 11 with P ions having an implantation energy of 750 KeV, thereby forming a threshold voltage controlling layer 143 of the retrograde P well at the top portion of the substrate 11.

Referring to FIG. 2D, annealing is carried out on the entire substrate including the above ion-implanted layers, thereby forming a P well 15 and an N well 16 as well as a bottom layer 17 of p type under the N well 16.

The related art clustered ion implantation experiences some problems since it is performed at an acceleration voltage having a magnitude measured in MeV. For instance, ion implantations at such a high acceleration voltage may cause point defects with high density, which may lead to an increase in the junction leakage current. Misalignment in lithography causes the punch-through voltage of n+/N-well and p+/P-well located at a well edge to be lowered.

In addition, when performing ion implantations at a high acceleration voltage in MeV, the thickness of photoresist may be varied by erosion, causing non-uniformity of the photoresist, such that the profile of ion implantation deviates from the set target, thereby producing variations in implant profiles.

SUMMARY OF THE INVENTION

The present invention is directed to system that substantially obviates one or more of the problems experienced due to the above and other limitations and disadvantages of the related art.

An object of the present invention is to provide a semiconductor device and fabrication method therefor which reduce the lateral diffusion of wells at a well edge.

Another object of the present invention is to provide a semiconductor device and fabrication method therefor which avoid the effective formation of a parasitic circuit around a CMOS, which is known commonly as latch-up.

Other and further objects, features and advantages of the present invention will be set forth in the description that follows, and in part will become apparent from the detailed description, or may be learned by practice of the invention.

To achieve these and other advantages and in accordance with the purpose of the present invention, as embodied and broadly described, the present invention includes a semiconductor device having a semiconductor substrate having a first conductivity type; a first well having a second conductivity type formed in a first region in a major surface of the semiconductor substrate by serial ion implantations; and a second well having the first conductivity type formed in a second region in the major surface of the semiconductor substrate by serial ion implantations.

To achieve the second object of the present invention, a method of fabricating a semiconductor device includes: selectively forming an insulating oxide layer in a semiconductor substrate having a first conductivity type, wherein the semiconductor substrate has first and second regions; forming impurity layers having a second conductivity type in the first and second regions of the semiconductor substrate; forming a first mask layer in the second region of the semiconductor substrate; forming impurity layers having the second conductivity type in the first region of the semiconductor substrate by performing serial ion implantations with different doses of dopants at different acceleration energies; forming a second mask layer in the first region of the semiconductor substrate; and forming impurity layers having the first conductivity type in the second region of the semiconductor substrate by performing serial ion implantations with different doses of dopants at different acceleration energies.

It is to be understood that both the foregoing general description and the following detailed description are exemplary and explanatory and are intended to provide further explanation of the invention as claimed. Thus, it should be understood that the detailed description and specific examples, while indicating preferred embodiments of the invention, are given by way of example only. Various changes and modifications that are within the spirit and scope of the invention will become apparent to those skilled in the art from this detailed description. In fact, other objects, features and characteristics of the present invention; methods, operation, and functions of the related elements of the structure; combinations of parts; and economies of manufacture will surely become apparent from the following detailed description of the preferred embodiments and accompanying drawings, all of which form a part of this specification, wherein like reference numerals designate corresponding parts in various figures.

BRIEF DESCRIPTION OF THE ATTACHED DRAWINGS

The accompanying drawings, which are included to provide a further understanding of the invention and which are incorporated in and constitute a part of this specification, illustrate embodiments of the invention and together with the description serve to explain the principles of the drawings. In the drawings.

DETAILED DESCRIPTION OF PREFERRED EMBODIMENT

Hereinafter, the present invention will be described in detail with reference to the accompanying drawings.

Figure 1:
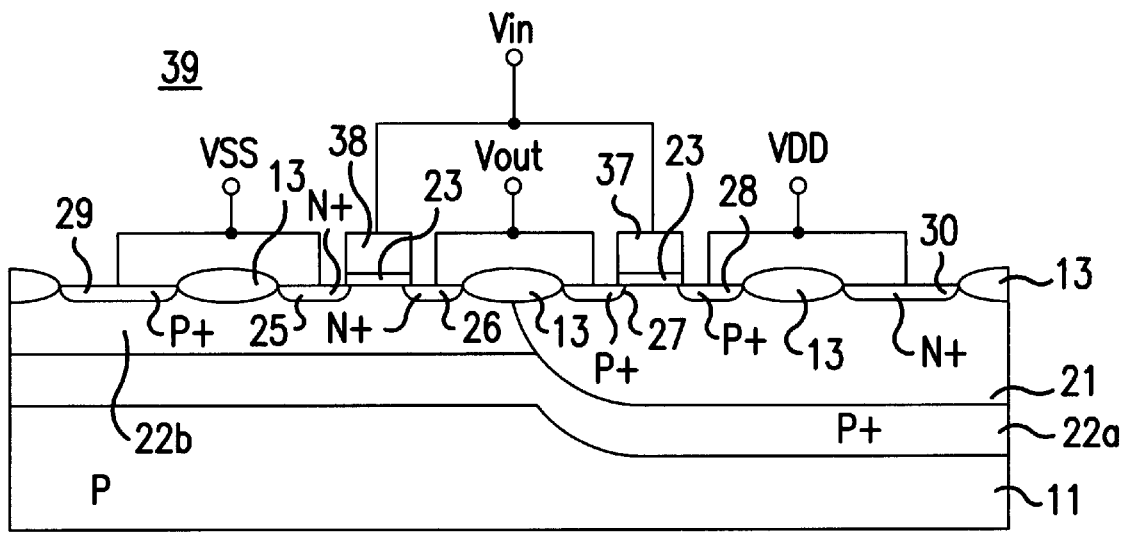
FIG. 1 is a cross-sectional view of the related art semiconductor device.
Figure 2A:
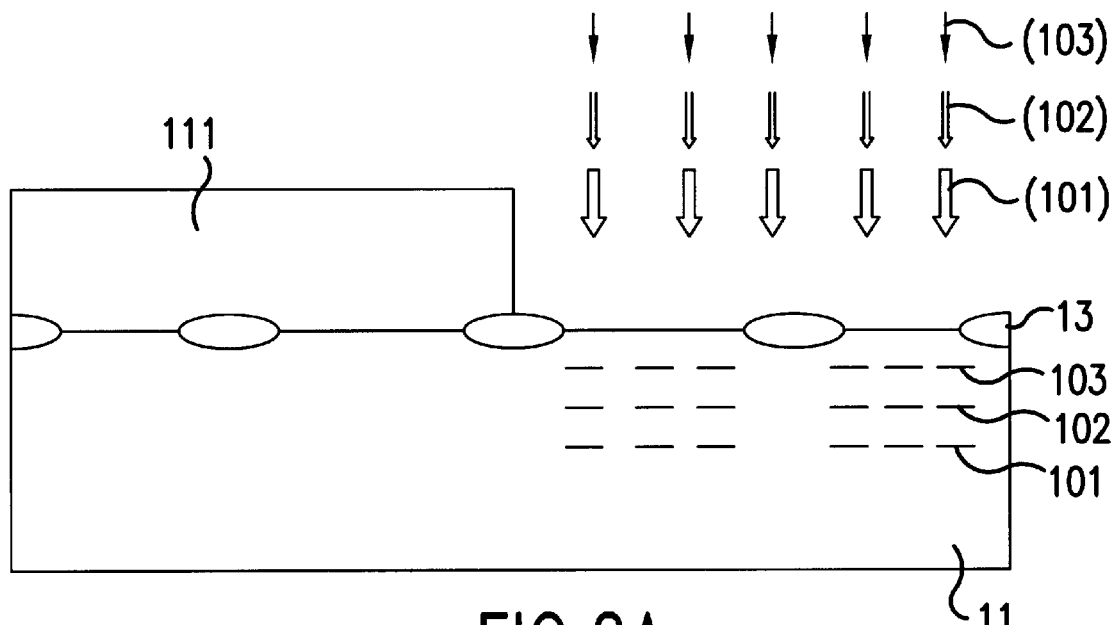
FIGS. 2A to 2D show cross-sectional views of a process used for fabricating a related art semiconductor device.
Figure 2B:
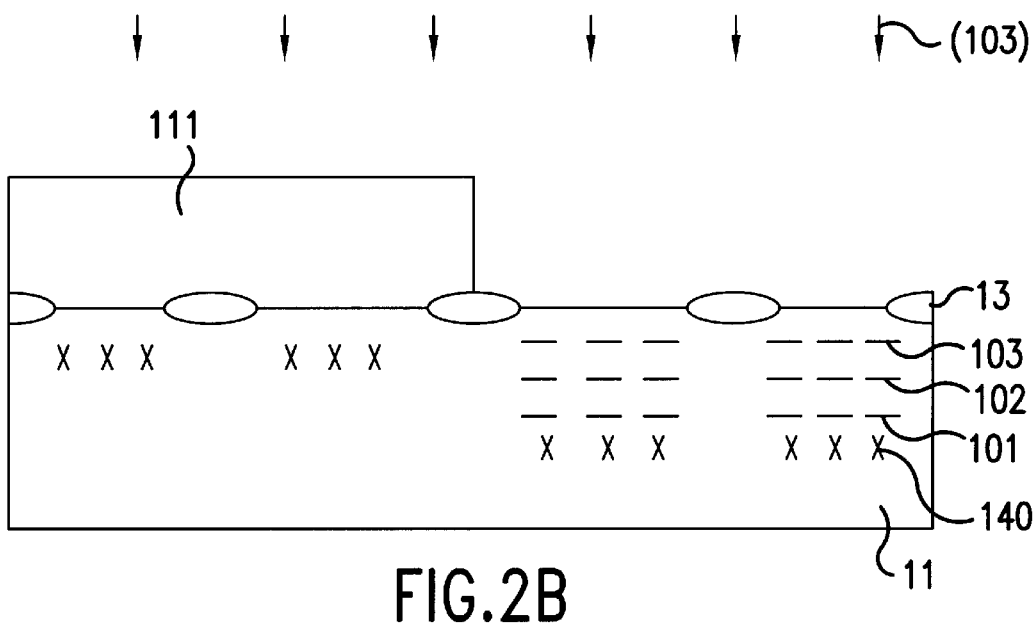
Figure 2C:
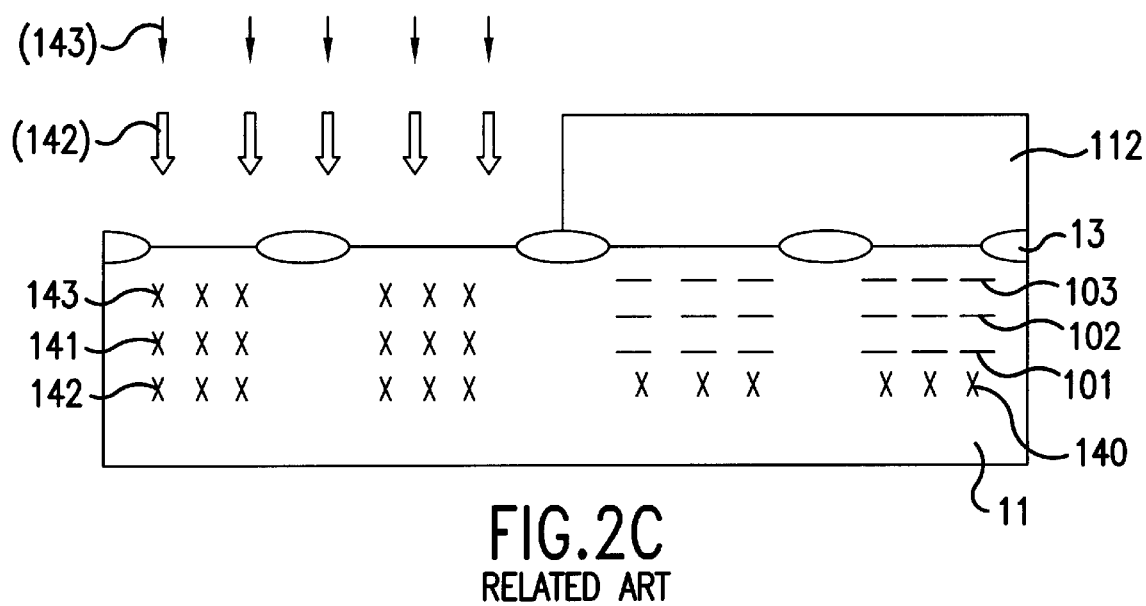
Figure 2D:
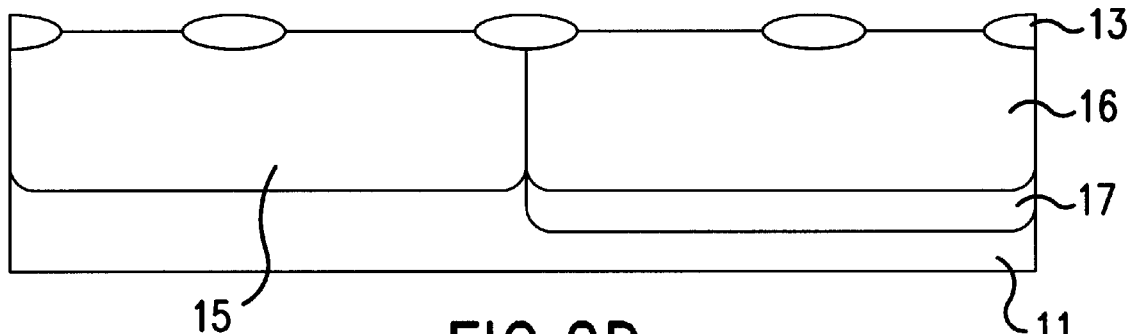
Figure 3:
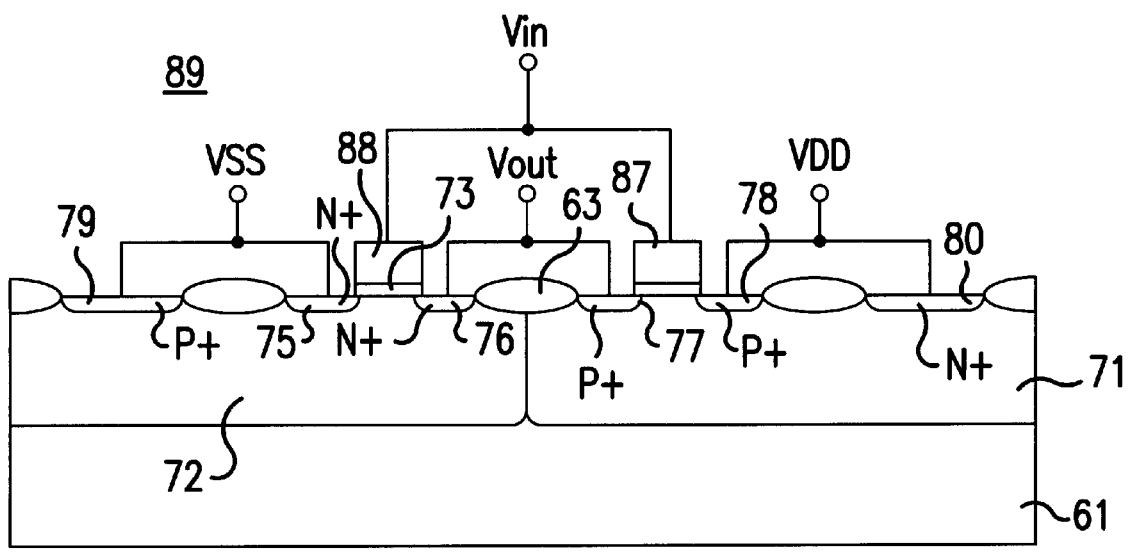
FIG. 3 is a cross-sectional view of a semiconductor device according to the present invention.

FIG. 3 is a cross-sectional view of a semiconductor device according to the present invention.

The present invention semiconductor device has P well and N well regions 72 and 71 formed in a P-type semiconductor substrate 61, e.g., a CMOS inverter circuit. An insulating oxide layer 63 is formed to define the active and isolation regions of the device. Heavily doped P-type regions 77 and 78 are formed in the N well 71 by using a first gate 87 overlying a gate-insulating layer 73 as a mask. A heavily doped N-type region of N-well contact 80 is then formed at a predetermined portion in the N well 71. The heavily doped P-type regions 78 and 77 become the source and drain regions of P-channel FET, respectively. Heavily doped N-type regions 75 and 76 are formed in the P well 72 by using a second gate 88 overlying the gate insulating layer 73 as a mask. A heavily doped P-type region of P-well contact 79 is then formed at a predetermined portion in the P well 72. The heavily doped N-type regions 75 and 76 become the source and drain regions of N-channel FET, respectively.

In the CMOS inverter circuit 89 having the above-described structure, the P-well contact region 79 and the source region of N-channel FET are connected to a ground line $V_{SS}$, while the source region 78 of P channel FET and the N-well contact region 80 are connected to a power source $V_{DD}$. The first and second gates 87 and 88 are connected to an input line $V_{IN}$, and the drains 76 and 77 of N channel and P channel Fetes are connected to an output line $V_{OUT}$.

In operation, a signal applied to line $V_{IN}$ at a high logic voltage level will simultaneously cause the N channel FET to turn on and the P channel FET to turn off. Thus, substantially no current flows between the drain and source regions 77 and 78 of P channel FET.

In this state, the output line $V_{OUT}$ connected to the drain regions 76 and 77 is pulled to the lower supply voltage $V_{SS}$ through the N channel FET. The CMOS inverter circuit 89 effectively inverts an input high logic voltage level to an output low logic voltage level.

FIGS. 4A to 4E are diagrams illustrating a process for fabricating the present invention semiconductor device.

Figure 4A:
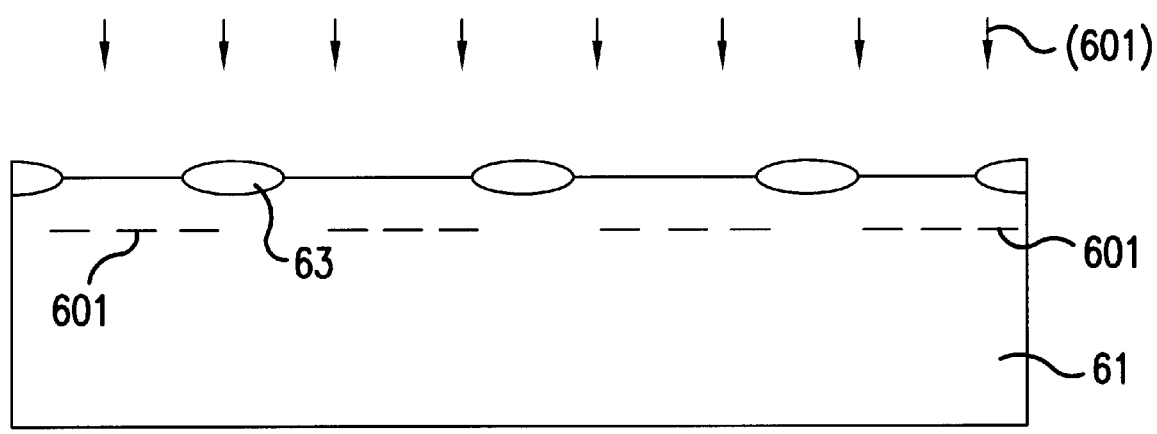
FIGS. 4A–4E are diagrams illustrating a process for fabricating a semiconductor device according to the present invention.

Referring to FIG. 4A, the insulating oxide layer 63 is formed on the P-type semiconductor substrate 61 by LOCOS (local oxidation of silicon) to define the active region of the device. A blanket implantation (601) of P ions is then performed on the entire part of the substrate 61 with a dose of dopants $4.0 \times 10^{12}/cm^2$ at an acceleration voltage of 250 KeV. In FIG. 4A, reference number 601 identifies an upper layer of retrograde N well as well as a counter-doped layer of retrograde P well.

The insulating oxide layer 63 may be formed by various techniques such as LOCOS, improved LOCOS, or STI (Shallow Trench Isolation). The thickness of the insulating oxide layer 63 is about 3,500 A.

Figure 4B:
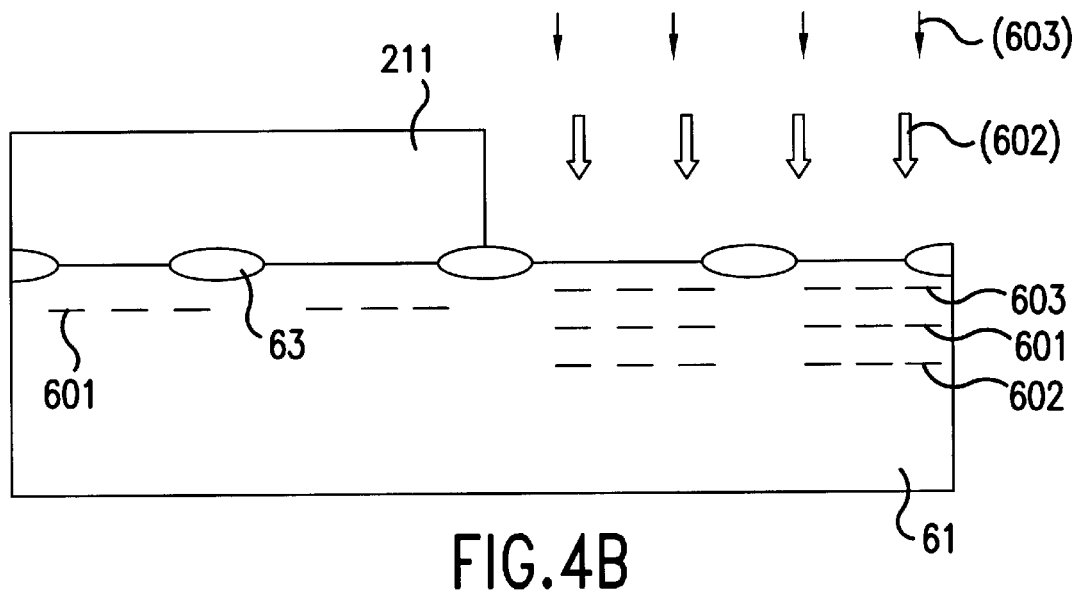

Referring to FIG. 4B, a photoresist 211 is formed on a portion of the structure, leaving exposed the region where N-well will be formed by lithography. Namely, the surface of the semiconductor substrate 61 is exposed on a portion where the N well will be formed. Subsequently, two serial ion implantations (602) and (603) are carried out onto the semiconductor substrate 61 using the 2.7 μm thick photoresist 211 as a mask. Thus, in FIG. 4B, reference numerals 602 and 603 identify a lower layer and a threshold voltage-controlling layer of retrograde N well, respectively.

The procedure of two serial ion implantations (602) and (603) is described as follows.

A first P ion implantation (602) is performed with a dose of dopants $2.0 \times 10^{13}/cm^2$ at an acceleration voltage of 700 KeV, forming a lower layer of retrograde N well.

A second P ion implantation (603) is performed with a dose of dopants $2.0 \times 10^{12}/cm^2$ at an acceleration voltage of 120 KeV, forming a threshold voltage layer at the surface of retrograde N well.

The second ion implantation (603) is performed by controlling the parameters of the ion accelerator in an ion injection apparatus without moving the semiconductor substrate 61 in a vacuum chamber to another equipment after the first ion implantation.

Figure 4C:
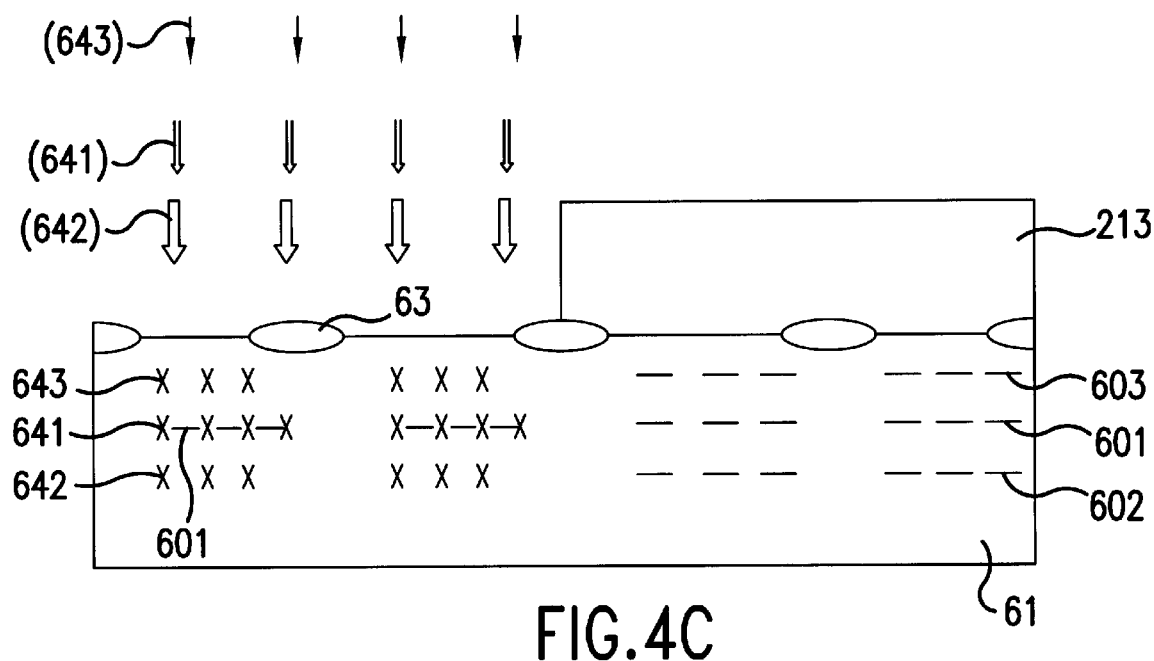

Referring to FIG. 4C, photoresist 211 is removed, and a photoresist 213 is formed at a portion except the region P-well will be formed by lithography. Namely, the surface of the semiconductor substrate 61 is exposed on a portion where the P well will be formed. Subsequently, three serial ion implantations are carried out onto the semiconductor substrate 61 by using the 2.7 μm thick photoresist 213 as a mask. Thus, in FIG. 4C, reference numerals (642), (641) and (643) identify a first, second and third B ion implantations, respectively, reference numerals 641, 642 and 643 identify an upper layer, a lower layer and a threshold voltage controlling layer of retrograde P well, respectively. Furthermore, in the P well region, the counter-doped layer 601 and the upper layer 641 of the retrograde P well lie at the same level, showing the same Rp (range of projection).

The procedure of three serial ion implantations is described as follows.

A first B ion implantation (642) is performed with a dose of dopants $1.5 \times 10^{13}/cm^2$ at an acceleration voltage of 350 KeV, forming a lower layer of retrograde P well.

A second B ion implantation (641) is performed with a dose of dopants $6.0 \times 10^{12}/cm^2$ at an acceleration voltage of 150 KeV, forming an upper layer in retrograde P well.

The second ion implantation (641) is performed by controlling the parameters of the ion accelerator in an ion injection apparatus without moving the semiconductor substrate 61 in a vacuum chamber to another equipment after the first ion implantation.

A third B ion implantation (643) is performed with a dose of dopants $1.0 \times E12/cm^2$ at an acceleration voltage of 80 KeV, forming a threshold voltage layer at the surface of retrograde P well.

The third ion implantation (643) is performed by controlling the parameters of the ion accelerator in an ion injection apparatus without moving the semiconductor substrate 61 in a vacuum chamber to another equipment after the second ion implantation.

P ions blanket-implanted into the entire substrate are counter doped due to an ion implantation using B ions with the opposite conductivity type into the P well region, such that the P well region is doped with B ions alone.

Figure 4D:
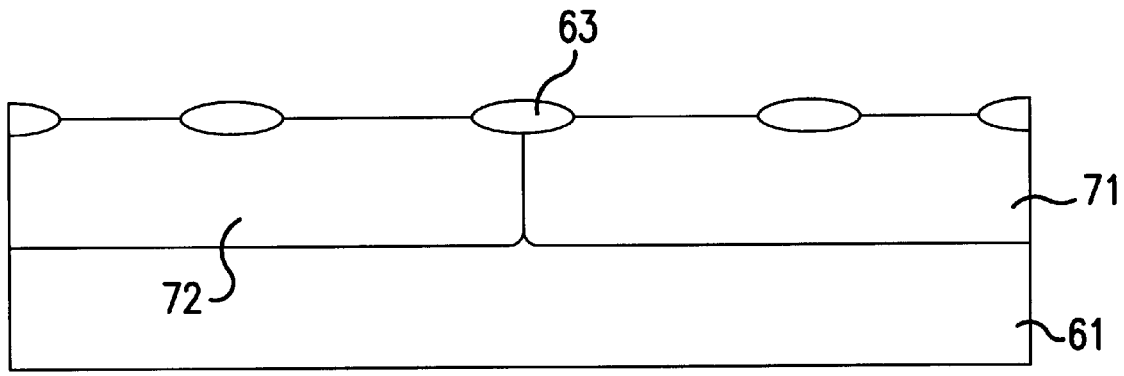

Referring to FIG. 4D, dopants implanted into the semiconductor substrate 61 are subjected to an annealing at 1000 C for 10 sec in an RTA (Rapid Thermal Anneal) apparatus to form a twin well with N well and P well regions 71 and 72 having a junction depth of about 1.5 μm in a retrograde profile.

For this structure, a P ion implantation is performed with a dose of dopants $2.0 \times 10^{13}/cm^2$ at an acceleration voltage of 700 KeV to form a lower layer of retrograde N well, and a second P ion implantation being performed with a dose of dopants $2.0 \times 10^{12}/cm^2$ at an acceleration voltage of 120 KeV to form a threshold voltage layer at the surface of retrograde N well. A B ion implantation is performed with a dose of dopants $1.5 \times 10^{13}/cm^2$ at an acceleration voltage of 350 KeV to form a lower layer of retrograde P well. A second B ion implantation being performed with a dose of dopants $6.0 \times 10^{12}/cm^2$ at an acceleration voltage of 150 KeV, forming an upper layer in retrograde N well, such that P ions implanted into the entire substrate with a dose of dopants $4.0 \times 10^{12}/cm^2$ at an acceleration voltage of 250 KeV are annihilated by a counter doping method, forming a middle layer of retrograde P well. A third B ion implantation is performed with a dose of dopants $1.0 \times 10^{12}/cm^2$ at an acceleration voltage of 80 KeV to form a threshold voltage layer at the surface of retrograde P well.

Figure 4E:
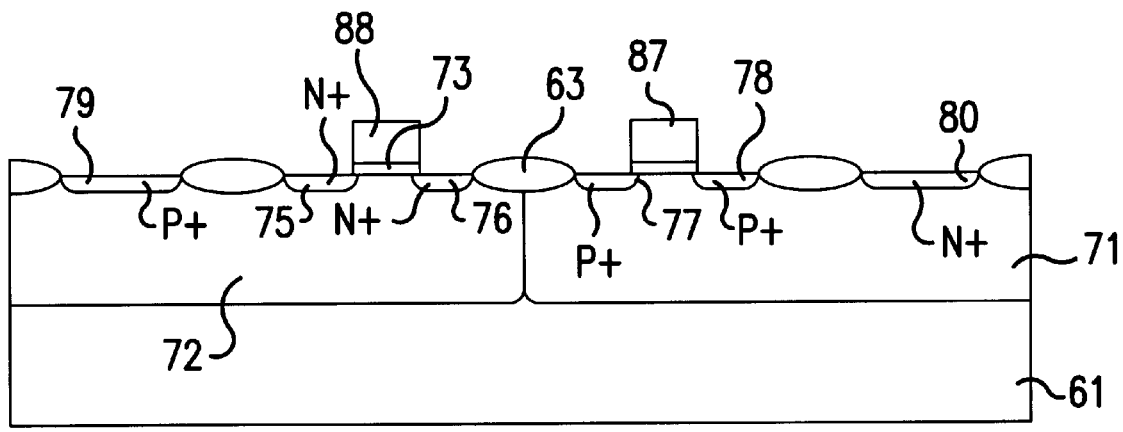

Referring to FIG. 4E, the gate insulating layer 73 is formed on the N well and P well regions 71 and 72 by a thermal oxidation or CVD (Chemical Vapor Deposition) method. Then, polysilicon is deposited on the gate insulating layer 73 and patterned by a photo-etch method to form the first and second gates 87 and 88. Both sides of the first and second gates 87 and 88 of N well and P well regions 71 and 72 are doped with a high dose of P-type and N-type ions to form the source and drain regions of P channel FET 78 and 77 and those of N channel FET 75 and 76, respectively. At the same time, predetermined portions in the P well and N well regions 72 and 71 are also heavily doped with P-type and N-type impurities, forming contact regions of P well and N well 79 and 80, respectively.

Namely, the contact region of P well 79 is formed at a predetermined portion in the P well region 72 simultaneously when the source and drain regions of P channel FET 78 and 77 are formed on both sides of the first gate 87 in the N well region 71. Similarly, the contact region of N well 80 is formed at a predetermined portion in the N well 71 at the same time when the source and drain regions of N channel 75 and 76 are formed in the P well region 72.

As described above, the method of fabricating the present invention semiconductor device relates to selectively forming an insulating oxide layer in a semiconductor substrate that has a first conductivity type and that includes first and second regions, forming impurity regions having a second conductivity type in the first and second regions of the semiconductor substrate, forming a first mask layer in the second region of the semiconductor substrate, forming impurity layers having the second conductivity type in the first region by serial ion implantations with different doses of dopants at different acceleration voltages, removing the first mask layers forming a second mask layer in the first region, and forming impurity layers having the first conductivity type in the second region by serial ion implantations with different doses of dopants at different acceleration voltages.

Accordingly, the present invention involves an ion implantation with P ions in the entire surface of the semiconductor substrate to lower lateral diffusion of wells such that punch-through is avoidable between the source/drain region of the transistor in wells and outside wells without an additional process. Furthermore, the acceleration energy is controlled to be below MeV in forming a twin well in the semiconductor substrate, suppressing point defects in the semiconductor substrate, which reduces a junction leakage current and leads to improvement of performances of the device.

It will be apparent to those skilled in the art that various modifications and variations can be made in the method of fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device comprising:

selectively forming at least one insulating oxide layer in a semiconductor substrate having a first conductivity type;

performing a blanket ion implantation with first dopants having a second conductivity type at a second energy on the entire semiconductor substrate so as to simultaneously form a counter-doped layer of a first retrograde well having the first conductivity type and an upper layer of a second retrograde well having the second conductivity type;

performing first serial ion implantations with the first dopants at a first energy and a third energy so as to sequentially form a lower layer and a threshold voltage controlling layer of the second retrograde well, respectively, wherein the first energy is greater than the second energy, and wherein the third energy is smaller than the second energy; and performing second serial ion implantations with second dopants having the first conductivity type at a fourth energy, a fifth energy and a sixth energy so as to sequentially form a lower layer, an upper layer and a threshold voltage controlling layer of the first retrograde well, respectively, wherein the second dopants implanted to form the upper layer of the first retrograde well have a dose greater than that of the first dopants blanket-implanted to form the counter-doped layer of the first retrograde well, such that the first dopants in the counter-doped layer are annihilated by the second dopants in the upper layer of the first retrograde well.

2. The method as claimed in claim 1, wherein the first and second retrograde wells each has a junction depth of 1.5 $\mu$m.

3. The method as claimed in claim 1, wherein the dose of the second dopants implanted to form the upper layer of the first retrograde well is about $6.0 \times 10^{12}/cm^2$ and wherein the dose of the first dopants blanket-implanted to form the counter-doped layer of the first retrograde well is about $4.0 \times 10^{12}/cm^2$.

4. The method as claimed in claim 1, further comprising:

selectively forming a first mask layer on the semiconductor substrate before performing the first serial ion implantations so as to expose a region where the second retrograde well is formed;

removing the first mask layer after performing the first serial ion implantations; and selectively forming a second mask layer on the semiconductor substrate before performing the second serial ion implantations so as to expose a region where the second retrograde well is formed.

5. The method as claimed in claim 4, further comprising:

annealing the first and second dopants that are implanted via the first and second serial ion implantations.

6. The method as claimed in claim 5, wherein the annealing is performed by a rapid thermal annealing apparatus.

* * * * *